United States Patent
Cremer

(10) Patent No.: US 8,173,278 B2
(45) Date of Patent: May 8, 2012

(54) COATED BODY

(75) Inventor: Rainer Cremer, Monschau (DE)

(73) Assignee: CemeCon AG, Wurselen (DE)

( * ) Notice: Subject to any disclaimer, the term of this patent is extended or adjusted under 35 U.S.C. 154(b) by 422 days.

(21) Appl. No.: 12/297,009

(22) PCT Filed: Apr. 20, 2007

(86) PCT No.: PCT/EP2007/003509
§ 371 (c)(1),
(2), (4) Date: Feb. 26, 2009

(87) PCT Pub. No.: WO2007/121954
PCT Pub. Date: Nov. 1, 2007

(65) Prior Publication Data
US 2009/0252973 A1 Oct. 8, 2009

(30) Foreign Application Priority Data
Apr. 21, 2006 (DE) .......... 10 2006 019 055

(51) Int. Cl.
*B32B 9/00* (2006.01)

(52) U.S. Cl. ....... 428/697; 51/307; 51/309; 204/192.15; 204/192.16; 428/698; 428/699; 428/701; 428/702

(58) Field of Classification Search ........... 51/307, 51/309; 428/697, 698, 699, 701, 702; 204/192.15, 204/192.16
See application file for complete search history.

(56) References Cited

U.S. PATENT DOCUMENTS

| | | | |
|---|---|---|---|
| 4,180,400 A * | 12/1979 | Smith et al. | 428/546 |
| 6,767,627 B2 * | 7/2004 | Morikawa et al. | 428/701 |
| 7,264,883 B2 * | 9/2007 | Yamamoto et al. | 428/698 |
| 7,348,074 B2 * | 3/2008 | Derflinger | 428/699 |
| 7,354,640 B2 * | 4/2008 | Kubota | 428/701 |
| 2010/0183884 A1 * | 7/2010 | Schier | 428/702 |

FOREIGN PATENT DOCUMENTS

| | | |
|---|---|---|
| DE | 103 60 482 A1 | 7/2004 |
| DE | 102004044240 A1 | 3/2006 |
| EP | 1 422 311 A2 | 5/2004 |
| EP | 1614655 A1 | 1/2006 |
| JP | 2002 239810 A | 8/2002 |

(Continued)

OTHER PUBLICATIONS

Yamamoto et al: "Structural and Mechanical property of Si incorporated (Ti, Cr, Al)N coatings deposited by arc ion plating process" Surface and Coating Technology, Elsevier, Amsterdam, NL, vol. 200, No. 5-6 Nov. 21, 2005, pp. 1383-1390.

(Continued)

*Primary Examiner* — Archene Turner
(74) *Attorney, Agent, or Firm* — Hiscock & Barclay, LLP

(57) ABSTRACT

A coated body and a process for producing a layer of hard material on a substrate are described. The body comprises a substrate (30) and a layer of hard material (36) which has been applied to the substrate (30) and at least partly covers the body. The layer of hard material comprises the metallic elements Al, Cr and Si and also nonmetallic elements selected from the group consisting of B, C, N, O. The atomic proportion of oxygen among the nonmetallic elements is greater than 30%. The layer of hard material is deposited on the substrate by means of magnetron atomization.

21 Claims, 4 Drawing Sheets

FOREIGN PATENT DOCUMENTS

| JP | 2004-106183 | * | 4/2004 |
|---|---|---|---|
| JP | 2006-137982 | * | 1/2006 |
| WO | WO 99/29920 A | | 6/1999 |
| WO | WO 03/085152 A | | 10/2003 |
| WO | 2006029747 A2 | | 3/2006 |

OTHER PUBLICATIONS

Seiten 1387 1388, Abschnitt 3.4 "Oxidation resistance evaluation", figures 6(c-1), 6(d-1), 7(b).

Wang D-Y et al: "Improvement of the interfacial Integrity of (Ti Al)N hard coatings deposited on high speed steel cutting tools" Surface and Coatings Techniology Elsevier Switzerland, vol. 120-121, Nov. 1999, pp. 388-394.

Karvankova P et al: "Thermal Stability of Cr1-xAlxSiyN coatings with medium to high Aluminium content prepared by arc evaporation" Surface Engineering for Manufacturing Applications. Symposium (Materials Research Society Symposium 28.11.-01.12.2005, Boston, [US], Materials Research Society Symposium Proceedings, vol. 890, 2006, pp. 85-90.

Roeder P L et al: "The System A1203-Cr203-Si02" Journal of the American Ceramic Society, vol. 51, No. 10, Oct. 21, 1968, pp. 585-594.

Derflinger et al: "Mechanical and Structural properties of various alloyed TiAlN-based hard coatings" Surface and Coating Technology, Elsevier, Amsterdam, NL, vol. 200, No. 16-17, Feb. 28, 2006, pp. 6493-4710.

Hirae M et al: "Oxidation behavior of Cr-Al-N-O thin films prepared by pulsed laser deposition" Preparation and Characterization, Elsevier Sequoia, NL, vol. 407, No. 1-2, Mar. 22, 2002, pp. 122-125.

* cited by examiner

COATED BODY

CROSS REFERENCE TO RELATED APPLICATIONS

This application is a National Stage application of co-pending PCT application PCT/EP2007/003509 filed Apr. 20, 2007, which claims the benefit of German application number 10 2006 019 055.6 filed Apr. 21, 2006. These applications are incorporated herein by reference in their entireties.

The present invention relates to a body comprising a substrate and a hard material layer applied to the substrate, and a method for its manufacture. The body can be, for example, a cutting tool for machining.

Coating the surface of bodies to improve the properties is a well-known approach. Coated bodies comprise a substrate material and one or more layers applied to it. In particular for tools, for example drills, mills or throw-away inserts, it is well known to apply one or more layers to a substrate material, such as high-speed steel or cemented carbides.

Various materials or material systems of various elements are known, from which hard material layers can be formed. These layers serve, in particular, to improve the hardness, hot hardness, wear resistance, frictional properties, chemical resistance and oxidation resistance.

In particular in the case of oxidation resistance, layers of aluminum oxide have proven suitable. These are often applied with CVD technology. U.S. Pat. No. 4,180,400 describes the deposition of crystalline alpha $Al_2O_3$ by means of thermal CVD. The CVD technology uses high temperatures, however, which lead to a corresponding stress of the substrate and to high tensile stresses in the layer. A further drawback is, amongst others, the contamination with halogens. Since steel materials become soft at high temperatures, CVD coatings for tools and wearing parts are primarily applied to hard metal. But even these relatively temperature-resistant substrates are made brittle in CVD by eta phase formation on the surface. Moreover, the high temperatures lead to detrimental high tensile stresses for which CVD is known due to the different heat expansions. The layers therefore usually have a network of cracks which weakens the laminar structure and deteriorates the corrosion protection of the layer.

An alternative coating technology comprises in particular plasma supported PVD methods. PVD methods using arc evaporation (arc methods) are known, wherein the metallic element is evaporated via the molten phase, but also magnetron sputtering is known, wherein targets of the material to be sputtered are used as a cathode of an electronic low-pressure glow-like discharge, wherein ions of the plasma atomize the targets.

The coating with oxide layers presents substantial limitations, however, in the coating technology used, since these layers are usually electrically insulating.

There is no lack of attempts to apply crystalline phases of the aluminum oxide by means of PVD techniques. As described in U.S. Pat. No. 4,790,920, U.S. Pat. No. 5,693,417 and U.S. Pat. No. 6,210,726, in particular the crystalline gamma phase can be produced at the low temperatures used.

EP-A-1614655 describes a hard material coating and a PVD manufacturing method therefor. The hard material coating is applied by means of a PVD method wherein on the one hand the material of an AIP target (Arc discharge Ion Plating) is transformed into a plasma by means of arc evaporation and on the other hand the material of an MS target (Magnetron Sputtering) is transformed into a plasma by means of magnetron sputtering. Herein, oxygen containing process gasses are introduced. The layer comprises the metal elements Si and at least one further element selected from the transition metals of the groups 4a, 5a and 6a of the period system, Al and B. The coating further comprises non-metallic elements selected from C, N and O. Oxygen is used to improve lubrication, wherein, however, the proportion of oxygen in the non-metallic elements is limited to 5 atom %.

EP-A-701982 describes multi-layer coatings. A laminate structure of ultra-fine particulate of carbides, nitrides, carbo-nitrides or oxides with metals of the groups 4-6 of the period system (IUPAC 1988), and B, Al or Si is described, wherein at least one layer is present in the cubic system and one layer is present in the non-cubic system or as an amorphous layer. The layers of the examples according to the invention are applied by means of low-voltage arc evaporation. The laminate structure must comprise more than two layers.

EP-A-1422311 describes hard material layers, which are produced by means of arc evaporation. The layer comprises, amongst others, the metallic elements Al, Cr and Si, and the non-metallic elements N, B, C and O. Multiple combinations of the above mentioned elements are mentioned, however the oxygen percentage in the non-metallic elements does not exceed 25 atom %.

It is an object of the present invention to provide a coated body, in particular a tool for machining, wherein layers having particularly advantageous properties are used.

This object is solved by a body according to claim 1 and a method according to claim 36. The dependent claims refer to preferred embodiments of the invention.

For the body according to the present invention, the hard material layer comprises the metallic elements Al, Cr and Si, and the non-metallic element selected from the group comprising B, C, N, O. The atomic percentage of oxygen in the non-metallic elements is greater than 30%.

Such a body has particularly advantageous surface properties, for example, when used as a cutting tool for machining. The high oxygen percentage results in the layer being excellently oxidation resistant. If the oxygen percentage is too low, this leads to poor oxidation resistance.

In addition to oxygen, further non-metallic elements can be present in the hard material layer, preferably from the group comprising B, C, N. With respect to the non-metallic elements in the layer, in the present specification, the relative atomic proportions of the non-metallic elements B, C, N, O are indicated amongst each other and indicated with the unit atom percent or atom %. The non-metallic elements are preferably largely predominant (i.e. more than 80 atom %) preferably almost 100 atom %, chemically bound to the metallic elements.

Preferably the atomic percentage of oxygen in the non-metallic elements is greater than 70%.

In the indications given in atom % it must be noted that the layers can always comprise additional elements due to, for example, the manufacturing process, which act as contaminants. In PVD sputter layers, the layers are usually contaminated with the inert gas used as the process gas. The contamination with Argon, for example, is usually not more than 3 atom %. A typical value is 1-2 atom %. The sputtering gas Krypton, if any, is not integrated, or to a much lesser extent.

Unlike CVD layers, the layers produced with PVD methods are free of halogenides and/or hydrogen.

The contamination by metals is usually low with sputtering, when the chamber and the support systems have already been covered with the coating material and the targets are of high purity.

In a particularly preferred embodiment, the oxygen percentage of the hard material layer is almost 100 atom %, i.e.

apart from any present contaminations, the only non-metallic element present in the layer is oxygen. The very high oxygen content results in excellent oxidation resistance.

In cases where a high hardness should be achieved as well as an increased oxidation resistance, alternatively the non-metallic elements can also be selected such that a nitrogen percentage is present as well as a high oxygen percentage (30 atom % and more). As has been shown, particularly hard layers of up to 3500 HV can be achieved if essentially (i.e. apart from the usual contaminants) only oxygen and nitrogen are present as non-metals, wherein the atomic percentage of nitrogen in relation to the sum of oxygen and nitrogen is equal to or greater than 10 atom % and equal to or smaller than 70 atom %. Further preferred is a nitrogen percentage of equal to or greater than 30 atom %, particularly preferred equal to or greater than 50 atom %.

The hard material layers can comprise further metals, preferably elements from groups 4-6 of the period system (according to IUPAC 1988). The admixture of other metallic (and non-metallic) elements should be limited in amount, however, since they could have a detrimental effect on the hardness, density, layer adhesion, laminate structure and layer tensions. Metallic elements which do not form mechanically stable oxides should be present in the layer only to a limited extent. This is because due to the use of oxygen as a reaction gas, oxides of these elements arise in the layer, which can enhance erosion of the layer during abrasive stresses. For example, titanium oxides are detrimental to the layer properties in the manner described.

By making a suitable selection of the proportionate amount of the metallic elements, the properties can be advantageously influenced. The percentage indications in atom percent (atom %) in the present specification, if not indicated otherwise, are the relative proportions of the metallic elements Al, Cr and Si among each other.

The metallic elements contained in the hard material layer are preferably primarily (i.e. more than 50 atom %) elements from the group comprising Al, Cr, Si. Further preferably, the atomic proportion of the metallic elements of this group is greater than 80 atom %. Particularly preferably the proportion is almost 100 atom %, i.e., apart from the contaminants present, if any, the only metallic elements present in the layer are Al, Cr and Si. An important reason for the advantages of the body according to the present invention is that the elements Al, Cr, Si all form stable oxides and nitrides. As will be described, nitrides can preferably be used for adhesion or transition layers to achieve good substrate adhesion.

Further compounds and oxides may be useful for improving the machining process, such as solid lubricants. However, in the actual hard material layer, their proportion must be limited as shown. They can be preferably provided as separate, top functional layers, or as intermediate layers, in a multi-layer structure.

Preferably the hard material layer comprises oxides and/or mixed oxide systems of the elements Al, Cr and Si. In numerous tests it has been found that hard material layers comprising a combination of oxide and/or mixed oxide systems of the elements Al, Cr and Si have particularly advantageous layer properties with respect to hardness, adhesion, tensile strength and oxidation resistance.

According to a preferred embodiment of the invention, the hard material layer comprises the metallic elements Al, Cr and Si in a proportion (in atom % of only the metallic elements) of x to y to z. Preferred is a composition having a Cr percentage y of between 1% and 70% and an Si percentage z of between 0.1% and 20%, the rest being Al. Further preferred is y of between 4% and 60%, z of between 0.5% and 10%, the rest being Al. Particularly preferred is y of between 10% and 50%, z of between 1% and 5%, the rest being Al. Outside of the claimed ranges, particularly the hardness and adhesion of the layers decreases, so that no advantages can be expected in wear and tear applications.

The hard material layer can be a one-phase layer, or be present in the gamma phase as $Al_2O_3$. Alternatively, the hard material layer can have plural phases. The hard material layer can be comprised, for example, of $Al_2O_3$ in the gamma, alpha or kappa phases, of $Cr_2O_3$, $SiO_2$, and of the substitution mixed crystals of the elements Al—Cr—Si—O.

In the presence of nitrogen, phases in the Al—Cr—Si—O—N system are also present, such as $Si_3N_4$, AlN, CrN and $Cr_2N$. These can be present as amorphous compounds, in particular the Si compounds.

Preferably crystalline phases and/or mixed phases in the Al—Cr—Si—O system are comprised in the hard material layer, in particular in the $(Al,Cr,Si)_2O_3$ composition.

Both cubic phases of the spatial group Fd3m and hexagonal phases of the R-3c spatial group can form. The hexagonal phases are primarily formed in Cr-rich compositions (such as above 50 atom % Cr). The cubic phases can be formed at a much lower Cr content substantially below 5 atom %. Substitution mixed crystals of gamma $Al_2O_3$, in which Al is replaced by other elements, also belong to the cubic phase. If such materials are inspected by means of X-ray diffraction, often only phases of the $(Al,Cr)_2O_3$ system can be seen. Presumably a certain Si content promotes the formation of these phases, since the phases only occur if Si is also present in the layer. On the other hand, the Si percentage should preferably remain limited since otherwise there is a reduction of the layer adhesion.

In the method according to the present invention, the layer is applied by means of magnetron sputtering. In magnetron sputtering the target is atomized directly from the solid phase. Unlike the present case, in PVD methods, the metallic element is evaporated via the liquid phase by means of arc evaporation (arc method).

Magnetron sputtering therefore avoids the resulting drawbacks, such as the integration of molten smallest particles, so-called droplets. In particular, however, it has been found with arc methods that the integration of oxygen can be problematic due to an instantaneous reaction of the oxygen with the molten deposited material. This also applies to thermal melting-on of metals from crucibles or by means of an electron beam.

In magnetron sputtering, wherein targets of the material to be sputtered are connected as cathodes of an electric low-pressure glow-like discharge, ions of the plasma atomize the target without the melting temperature of the target material having to be reached. To increase plasma density and material removal rates, a magnet system is arranged behind the target.

The temperatures can be kept low, by cooling the target, for example. This is how reactions of the target material with the reactive gasses are kept minimal. For this reason the magnetron method is particularly suitable to deposit oxides, in particular aluminum oxide at low temperatures. The temperatures preferably remain below 500° C.

By an additional negative potential at the substrate table, the substrate can be bombarded with ions during coating. This usually improves the quality of the layer properties such as density, adhesion, hardness, porosity, amongst others. The ion bombardment, further promotes layer formation by reaction with the present reactive gas, in the present case preferably oxygen.

The targets are uniformly removed after a short initiation period in magnetron sputtering according to their material proportions. The targets can also comprise alloys or compounds of the coating materials. Further, the targets can also be composed of different material segments. When a plurality of magnetrons is used, they can further be loaded with different target materials. Basically, coatings with all metals and metalloids can be produced.

If the temperatures are to be chosen very low and if a high proportion of crystalline phases is present in the hard material layer, means for additional ionization, such as hollow electrodes, can be used.

For the magnetron deposition of oxides, the electrodes can be driven with an alternating voltage instead of the conventional DC plasmas. The documents U.S. Pat. No. 4,046,659 and U.S. Pat. No. 4,013,532, and DD252205 describe coating devices and methods, wherein the electrodes are not driven with a DC voltage but by means of an alternating voltage (pulsed plasmas).

According to an embodiment of the invention, the so called "High Power Impuls Magnetron Sputtering" (or in short HIP-IMS) is used. This is characterized by short pulses of very high power. The power of the pulses can be high to such an extent that the targets reach a power density of between 500 and 5000 W/cm$^2$, which is applied, however, for no more than 20% of the cycle time. Due to the very low duty factor (on time to off time) the power averaged over time will be in the same range as with conventional DC or pulsed PVD methods. There is, however, a nearly complete ionization in front of the target. As has been found for the layers according to the present invention, HIPIMS results in particularly dense and hard layers.

According to an embodiment of the invention, an adhesion layer is arranged between the substrate, i.e. the material of the base body, and the hard material layer. This results in a substantial increase in the layer adhesion on the substrate. Each composition and thickness of the adhesion layer should be chosen depending on the substrate material. The chemical bonding, the coefficient of expansion and the lattice parameters of the substrate and the layer are important in this context.

The adhesion layer is preferably comprised of a selection of elements from the set comprising Al, Si and elements of groups 4-6 of the period system according to IUPAC (1988), and of a selection of non-metallic elements from the group comprising B, C, N, O. The elements Ti, Al, Si, Cr are the preferred metallic components of the adhesion layer. The percentage of oxygen is lower in the adhesion layer than in the hard material layer. The adhesion layer is preferably directly applied to the substrate material.

Preferably, the metallic elements of the adhesion layer are selected from the group of the metallic elements of the hard material layer. Further preferably, an atomic percentage of N in the non-metallic elements is present in the adhesion layer which is greater than in the hard material layer. The percentage of N is particularly preferably essentially 100 atom %, i.e. it is a pure nitride layer apart from contaminations.

Preferable is a combination of the hard material layer and the adhesion layer, in which the hard material layer is essentially (i.e. apart from contaminations from metallic or non-metallic elements) of Al, Cr, Si and O, and the adhesion layer is essentially of Al, Cr, Si and N, in particular crystalline (Al,Cr,Si)N. Alternatively, the adhesion layer can also be crystalline (Ti,Al)N and the hard material layer AlCrSiO.

While the hard material layer can directly follow the adhesion layer, according to an embodiment of the invention, however, a transition layer is preferably arranged between the adhesion layer and the hard material layer. It is composed of a selection of the elements forming the hard material and adhesion layers. This is how a transition is made between the composition of the adhesion layer and the composition of the hard material layer.

It has proven particularly useful to choose the same composition of metallic elements for the adhesion and transition layers as in the hard material layer and to use primarily N as the non-metallic element. This particularly applies to cemented carbide substrates.

Preferably in the transition layer, in the direction transverse to the layer, at least one element continuously changes in its concentration, so that the concentration of the element at the boundary to the hard material layer is essentially equal to the concentration in the hard material layer, and at the boundary to the adhesion layer it is essentially the same as the concentration in the adhesion layer. The varying element is preferably N, O or both of these elements.

A great number of possible layer sequences is conceivable. In the most simple case, the body only consists of the substrate material with a hard material layer having a constant composition. Preferably, as described above, at least one adhesion and intermediate layer is present between the substrate and the hard material layer. Since the adhesion layer, and sometimes also the transition layer, can be partially exposed in operation when the hard material layer is subjected to excessive wear, the properties of these layers are also relied upon to protect the substrate. The thickness of the entire laminate system is for example 1-10, preferably 2-8, particularly preferably 3-5 µm. If an adhesion layer is present, it is for example 10-70%, preferably 25-60%, particularly preferably at least 35% of the laminate system. The thickness of the transition layer can be in the same order of magnitude as that of the hard material layer. The transition layer, however, is preferably thinner, and is further preferably in the range of between 2-200 nm.

However, the body can also comprise a multi-layer coating, for example. It can comprise layers having compositions as described above as adhesion and transition layers, alternating with the described hard material layers. A succession of hard material layers is also possible, wherein the composition of the metallic elements varies essentially periodically. For example, multi-layer coatings are advantageous, during the manufacture of which the reactive gasses $N_2$ and $O_2$ are periodically and oppositely varied in order to produce corresponding periodic variations in the laminate material. Other multi-layer coatings result when targets of different compositions are switched on and off or varied in their power. Multi-layer coatings with single layer thicknesses in the nanometer range result when the substrates are periodically carried on rotary table past targets having different compositions.

Embodiments of the invention will be described in the following with reference to the accompanying drawings in more detail. In the drawings:

FIG. 1 is a schematic illustration of an example of components of a PVD coating machine, FIG. 2 is a schematic illustration of a first embodiment of a coated body with an adhesion layer, a transition layer and a hard material layer, FIG. 3 is a schematic illustration of a second embodiment of a coated body with a multi-layer structure, FIG. 4 is a photograph of a polished section of a first embodiment of an (Al,Cr,Si)$_2$O$_3$ hard material layer, FIG. 5 is a photograph of a polished section of second embodiment of an (Al,CR, SI)$_2$O$_3$-hard material layer, FIG. 6 is a photograph of a polished section of an Al$_2$O$_3$ hard material layer on an (Al,Cr,Si)N adhesion layer as a comparative example, FIG. 7 are XRD spectra in diagrammatic form of hard material layers of the Al—Cr—Si—O type, and FIG. 8 shows an XRD spectrum in diagrammatic form of a hard material layer of the Al—Cr—Si—O—N type.

FIG. 1 is a symbolic illustration of an example of components of a PVD coating machine 10 for carrying out magnetron sputtering methods. Such machines and their manner of operation for applying coatings are known per se to the person skilled in the art so that only a short general explanation of machine 10 will be given. Special modes of operation for producing layers according to the present invention will be explained later.

In a coating chamber 12 under low pressure, a number of, in the present example four cathodes 16 and a substrate holder 18 (consisting of a rotating substrate table 20 with a number of holding supports 22, rotatable in turn) are arranged. The process gasses, consisting of an inert gas, such as Argon, and reactive gasses, such as $N_2$, $O_2$, are supplied via a gas inlet 24.

Cathodes 16 are formed as magnetron cathodes and each have targets formed as plates of the material to be sputtered. For the Al—Cr—Si system, Cr or Si, for example, can be provided in the form of plugs in bores of an aluminum plate and/or compound or alloyed targets of the materials can be used. If a plurality of magnetron targets is present, as shown, each magnetron can sputter one component, and the concentrations may be particularly advantageously adjusted by the electric power applied to each magnetron.

As is known to the person skilled in the art, in magnetron sputtering the composition of the layer approx. corresponds to the composition of the target, if it was previously introduced. On the side of the target, the composition in the area of the erosion trench formed by the magnetic fields of the magnetron is essential.

In operation, a voltage of for example about 500 volts is applied to cathodes 16 of machine 10. To avoid charges with high oxygen content, cathodes 16 can be individually or oppositely pulsed. Ions of the working gas are alternately accelerated between respective two targets and sputter them. Additionally gaseous oxygen or nitrogen is introduced via the gas inlet as a reactive gas. Under the influence of the electric and magnetic fields in the area in front of cathodes 16, a coating atmosphere in the form of a plasma is formed. The coating atmosphere contains the introduced gaseous components and the sputtered components of the targets.

Alternatively the coating machine can also be formed so that it can execute the HIPIMS coating method. In this method, the targets are operated with short high-power pulses, however at a low duty rate. The fundamentals of HIPIMS can be found, amongst others, in Kouznetsov, et al., "A Novel Pulsed Magnetron Sputter Technique Utilizing Very High Target Power Densities" in Surface and Coatings Technology, 1999, pp. 290-293, vol. 122. The coating machine in this case includes special power supplies suitable for HIPIMS, such as they are described in U.S. Pat. No. 6,296,742. In addition, as described in EP-A-1609882, various approaches can be adopted to direct the ions onto the substrate after the pulse.

The respective composition of the coating atmosphere depends on the sputtering rates of the target materials and on the adjusted gas flow. It can be influenced by a suitable choice of material of the targets (free surface of each target material while taking the sputtering rate into account), but also by the different addition of gaseous components. It is known, for example, that a so called "poisoning" (i.e. formation of an oxide already on the solid target material) of a target of Al results when oxygen is introduced. Since the sputtering rate also depends on the degree of poisoning (with poisoned targets there is a dramatic reduction of the sputtering rate) the Al percentage in the coating atmosphere can selectively be adjusted by adjusting the influx of a gaseous component (here: $O_2$).

The elements of the coating atmosphere are deposited on the substrates, i.e. on tools, such as drills, throw-away inserts etc. attached on substrate holder 18. Herein, a potential difference is created between the substrates and the plasma, for example by means of a voltage source between substrate holder 18 and the wall of chamber 12. Due to this biasing voltage, the substrate is bombarded with ions of the working gas which leads to a higher density of the layer and to a higher application of energy during layer formation. Crystalline phases can thus be formed in spite of low substrate temperatures.

The described ion sputtering and various other PVD coating techniques are basically known to the person skilled in the art so that, using the information given herein, he will be able to deposit a layer of the elements of each selected system on a substrate and to adjust the parameters of the method, such as the composition of the coating atmosphere, the substrate temperature, the power of the cathodes, the biasing voltage etc., so that a laminate structure results with the desired layer rate and structure.

To create layers comprising embodiments of the present invention, the following is to be observed:

Bodies, in particular tool base bodies, are used as work pieces, which consist of the selected substrate materials, such as tool steel (e.g. high-speed steel) or cemented carbides (e.g. WC—Co hard metal). These are attached on substrate holders 18. In the well-known manner this is followed by preparing the substrate by ion bombardment. To achieve this, a plasma is created in chamber 12 without electric power applied to the targets and by only supplying an inert gas (Argon) and by applying a high biasing voltage between the plasma and the substrates.

In the following coating step, the material of the targets is sputtered and a reactive gas is supplied in addition to the inert gas, so that the corresponding materials are deposited from the plasma onto the substrate.

First an adhesion layer is created on the substrate. To achieve this, the targets can be oppositely electrically pulsed in pairs in the described manner. Nitrogen is introduced as a reactive gas so that a layer is deposited on the substrate. In a preferred example it is an (Al,Cr,Si)N layer.

As soon as the desired layer thickness of the adhesion layer is reached, a transition phase starts in which a transition layer is deposited on the adhesion layer. To achieve this, the composition of the process gas is changed while driving of the targets remains the same so that the nitrogen content is continuously reduced in favor of an oxygen content over the duration of the transition phase. At the end of the transition phase, either no more nitrogen is introduced to create a pure oxide layer, or nitrogen is continued to be supplied at a low level.

Hereafter, the method is continued with the application of an Al—Cr—Si oxide layer (also as a nitride layer, in small proportion, if any). To do this, oxygen is introduced exclusively or at least primarily as a reactive gas. After reaching the desired layer thickness, the process is ended.

FIG. 2 schematically shows the resulting laminate structure. On substrate 30 there is an adhesion layer 32, the composition of which depends on the elements (i.e. reactive gas and atomized targets) present in the plasma during application. The thickness of the adhesion layer depends on the chosen coating duration with the corresponding conditions. The adhesion layer is followed by a graded transition layer 34, wherein the thickness and composition can be chosen as described above. The transition layer is followed by hard material layer 36.

FIGS. 4 and 5 show photographs of polished sections of coated bodies with $(Al,Cr,Si)_2O_3$ hard material layers 36a, 36b which were deposited under the same conditions on the same adhesion layer. Only the composition of the targets was changed. The hard material layers contain several atom % Si and show a crystalline microstructure.

Figure 1:
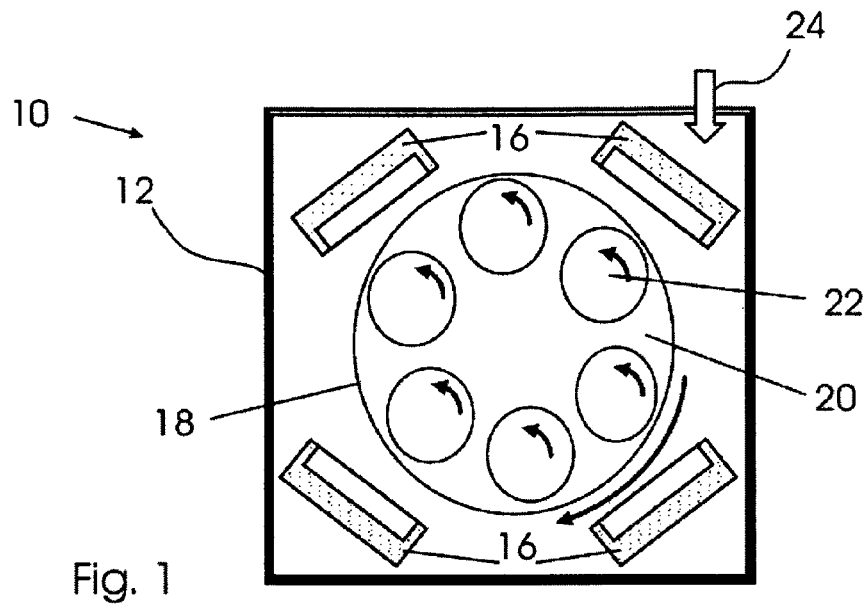
Figure 2:
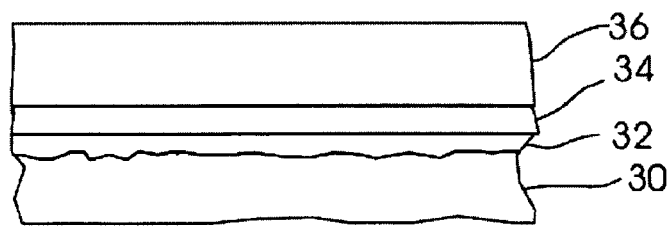
Figure 3:
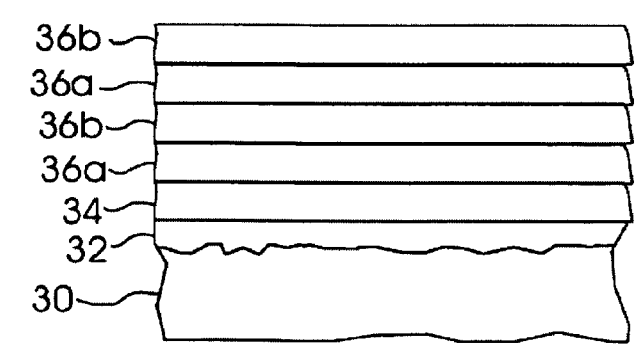
Figure 4:
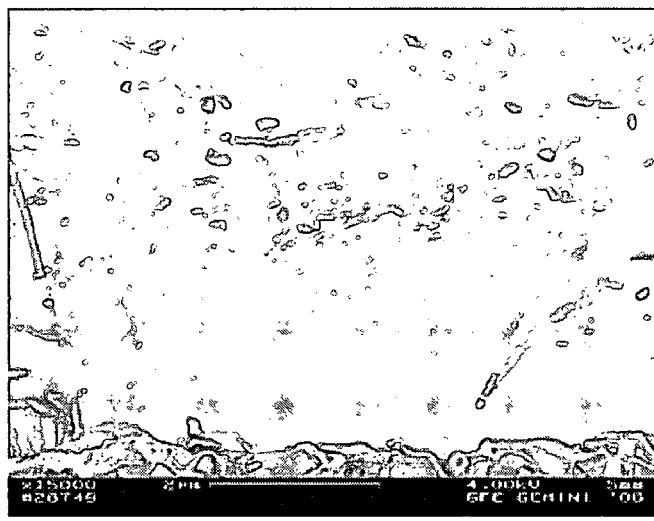
FIG. 4 shows a Cr-depleted layer 36a with a cubic phase of the Fd3m spatial group.
Figure 5:
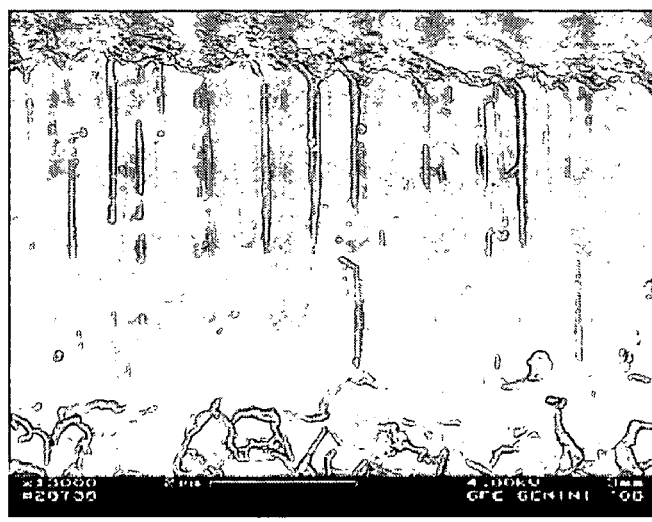
FIG. 5 shows a Cr-rich hard material layer 36b with a hexagonal phase of the R-3c spatial group. The hard material layer has a columnar crystalline microstructure.
Figure 6:
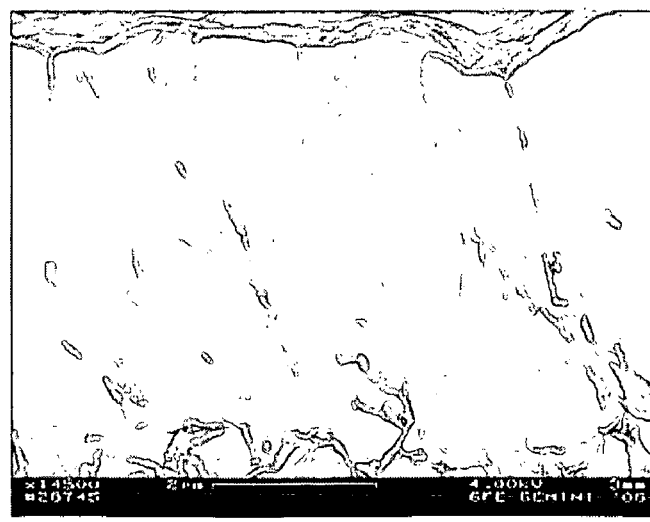
FIG. 6 shows for illustration a comparative example with a pure $Al_2O_3$ hard material layer on an (Al,Cr,Si)N adhesion layer. The $Al_2O_3$ layer has an amorphous appearance.

Hard material layer 36 in FIG. 2 was produced with constant conditions over the coating duration. Alternatively, a multi-layer structure can also be created, when the conditions change on the substrate during the coating duration. FIG. 3 schematically shows such a multi-layer laminate structure. On substrate 30, there is an adhesion layer 32 and a transition layer 34.

The coating on top of this comprises alternating layers 36a and 36b (in the example shown, two each, while of course any number can be created). Layers 36a and 36b differ in their compositions. They can be created, for example, by introducing different process gasses during the coating duration (for example alternating nitrogen/oxygen) or by providing different targets.

Figure 7:
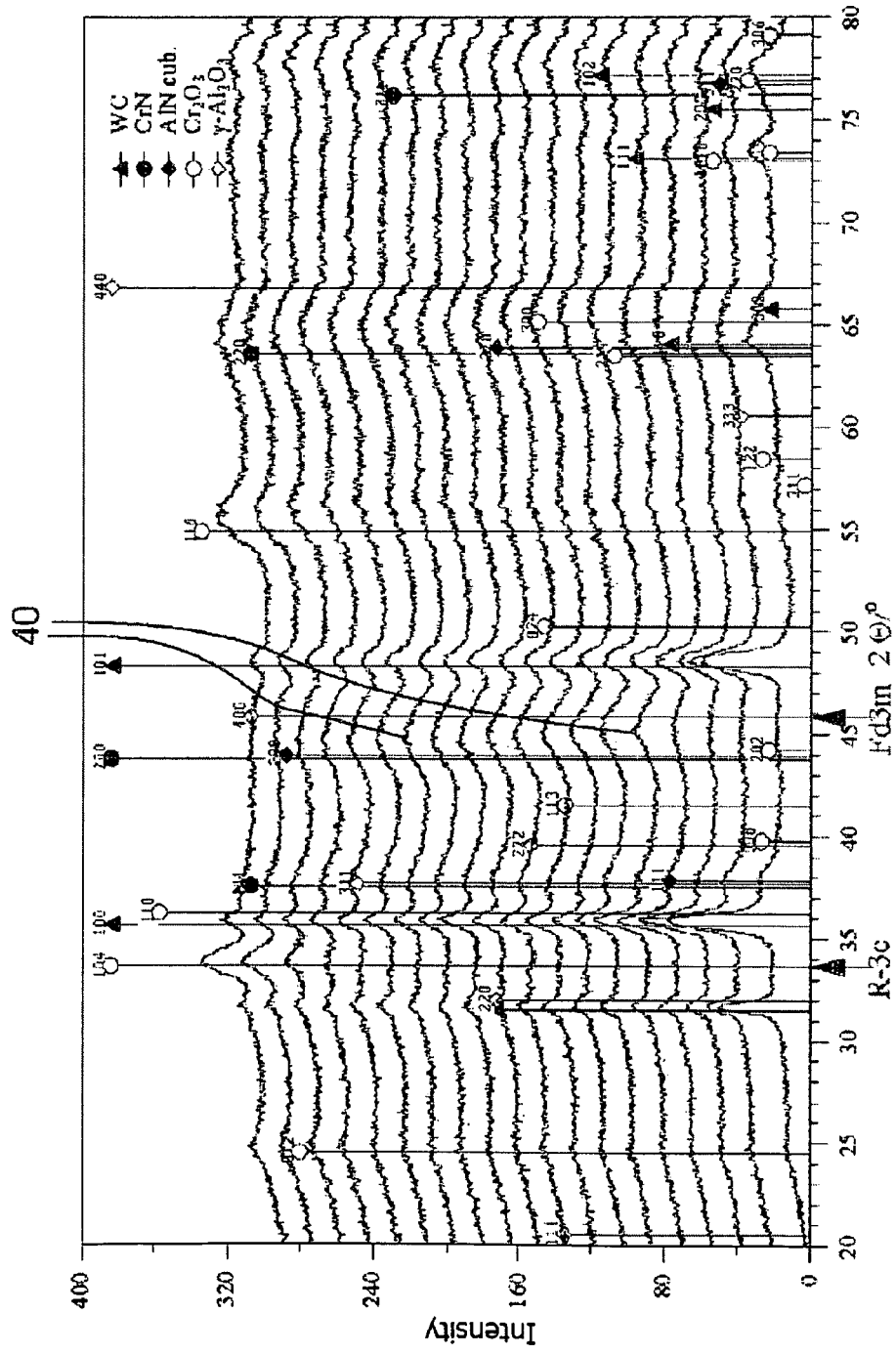

The structure of the hard material layer produced depends on the composition. FIG. 7 shows XRD spectra of hard material layers of the Al—Cr—Si—O type. These layers were deposited on an Al—Cr—Si—N intermediate layer on a WC—Co hard metal. The process conditions were the same except for the composition of the targets.

In FIG. 7 the atomic proportion of Si of the metals is about 5 atom %, and the Cr proportion increases from bottom to top from about 20 atom % to 70 atom %. The remainder is aluminum. At an angle 2-teta of almost 46°, the position of the (400)-gamma $Al_2O_3$ peak is indicated with a line. As the Cr content rises, above a certain Cr content a peak 40 is formed on the left from there, which moves further to the left as the Cr content rises, indicating the increasing substitution of Al by Cr in the $(Al,Cr,Si)_2O_3$ crystal. If the chromium content rises still further, the associated peak decreases, and the peak of a hexagonal phase with the R-3c spatial group at a 2-teta angle of 34° is increasingly present.

These peaks are found only in a certain concentration range of the elements. The percentage indications in atom percent (At. %) are the relative proportions of the metallic elements Al, Cr and Si among each other. Other metallic elements were not present in the layers. In the XRD spectrum, phases of the intermediate layer and phases with tungsten can also be seen. The latter are due to the cemented carbide substrate.

Concrete examples of embodiments of the invention will be given in the following:

Example 1

Al—Cr—Si Oxide Layer

On a cemented carbide tool, an Al—Cr—Si oxide layer is to be deposited with an Al—Cr—Si nitride adhesion layer and an Al—Cr—Si oxinitride transition layer in the PVD method.

In a machine of the CC800 type of the applicant, there are four targets of plates of an Al—Si alloy with 10 atom % silicon, in which Cr plugs have been inserted. The Cr proportion in the surface in the erosion trench is about 33%. All targets used were introduced before the tests.

At the beginning of the process, the substrates are heated to about 400° C. After the usual plasma etching of the substrates by bombardment with Argon ions, nitrogen gas is introduced in addition to the Argon. The cathodes were driven in pulse operation in a bipolar manner between two cathodes each at a frequency of 250 kHz.

A power of 5 kW is adjusted for each of the 4 cathodes, i.e. 20 kW overall. A substrate temperature of 520° C. is reached, where the crystalline Al—Cr—Si nitride layers are deposited. A layering rate of about 1.5 μm/h results from the adjusted parameters. After a few minutes, the nitrogen gas is slowly reduced to zero over a few minutes, while at the same time the oxygen gas is increased to its setpoint value.

The layer thickness is about 3.5 μm after 2.5 hours. The size of the particles of the layer is about 50-100 nm. The hardness of the layer created is about 2400 HV. In the XRD spectrum the gamma phase of an $(Al,Cr)_2O_3$ or $(Al,Cr,Si)_2O_3$ substitution mixed crystal is shown.

Comparative Example 1

Essentially the same parameters as in example 1 are set, however, the targets do not contain silicon any more, but consist of pure aluminum with Cr plugs. The parameters were slightly adapted in view of the changed targets. The coating period was chosen such that the same coating thickness resulted as in example 1.

The hardness of the layer created is about 2200 HV. In a manually carried out abrasion test, unlike example 1, there is a failure of the edges, since the layer is partially released. In the XRD spectrum, no phases of the Al—Cr—O system can be seen.

Comparative Example 2

Essentially the same parameters as in example 1 are set, however, the targets are only aluminum. The parameters were slightly adapted in view of the changed targets. The coating period was chosen such that the same coating thickness resulted as in example 1. The hardness was only 1200 HV. Crystalline phases of the $Al_2O_3$ could not be found, or only very rarely, if at all.

Example 2

The same parameters as in example 1 are set. However, two of the targets have an Si content reduced by half. By rotating the substrate table in front of the targets, a multi-layer system results with continuously changing Si content, and consequently with varying compositions of the $(Al,Cr,Si)_2O_3$ phase. Compared with example 1, there is an improved adhesion in the Rockwell test.

Example 3

Essentially the same parameters as in example 1 are set, however, two of the four targets respectively consist of a titanium plate with aluminum plugs. Since only two of the four targets are driven at any one time, the coating period must be extended correspondingly. First only the two TiAl targets are driven with nitrogen as a reactive gas, until a TiAlN layer is created to a thickness of about 2 μm.

Subsequently the magnetrons with the TiAl targets are switched off and those with the AlCrSi targets are switched on. Directly afterwards, the introduction of nitrogen is stopped and, at the same time, oxygen is introduced. A transition layer of AlCrSiNO of a thickness of about 100 nm is created, on which an AlCrSiO layer then grows, as in example 1. At an overall layer thickness of also 3.5 μm, the process was stopped: within the range of the measuring precision, the layer has the same good quality as the layer in example 1.

Example 4

In a further example, the substrate is coated with a hard material layer of CrAlSiO(N) by means of pulsed DC magnetron sputtering.

The coating was deposited by means of two targets with a composition in a ratio of Al:Cr:Si of 60:35:5 atom %. First a CrAlSiN layer with a thickness of 1.7 μm is applied under the following conditions. Target power 3100 W, target voltage 310 V, total pressure 500 mPa, $N_2$ flow 135 ml/min, Ar flow 400 ml/min and substrate temperature 300° C.

Then a 0.2 μm thick transition layer was produced by decreasing the $N_2$ flow to 60 ml while at the same time increasing the $O_2$ flow from 0 ml to 17 ml.

Then, a hard material layer with a thickness of 2.9 μm is applied under the following conditions: target power 3100 W, target voltage 350 V, total pressure 255 mPa, $N_2$ flow 60 ml/min, Ar flow 240 ml/min, $O_2$ flow 17 ml, substrate temperature 300° C. Since nitrogen is less reactive, relatively more nitrogen has to be introduced.

The nitrogen percentage in the hard material layer is 45 atom %. In the metal proportions, atom ratios of Al:Cr:Si of 57:37:6 result.

Figure 8:
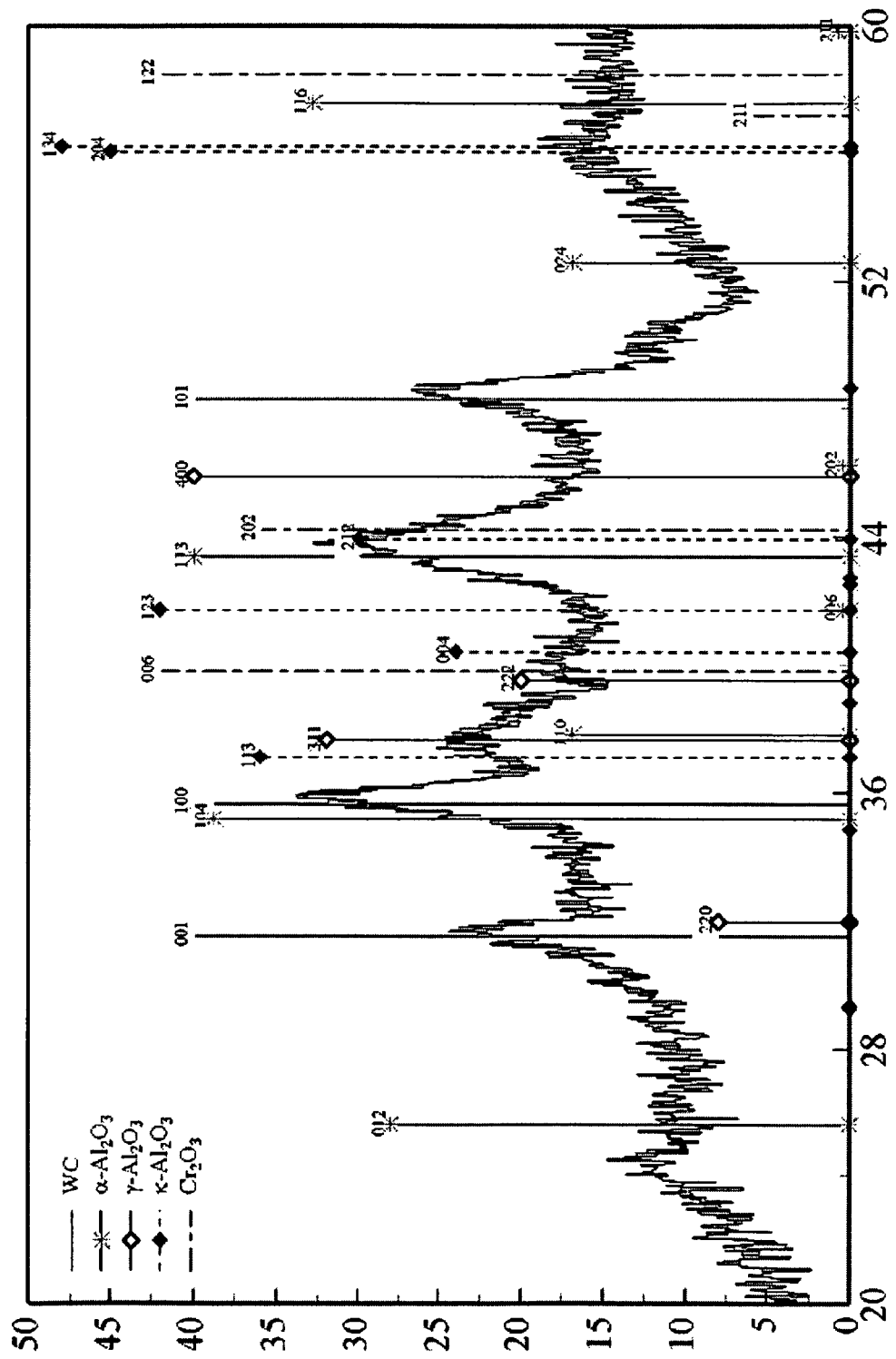

In FIG. 8 an XRD spectrum of the created hard material layer is shown. The associated XRD spectrum shows peaks of crystalline $Cr_2O_3$ and of gamma and kappa $Al_2O_3$. The Si present shows no own crystalline phases, but is present as amorphous Si or as an amorphous Si compound, such as $Si_3N_4$, at the particle boundaries. Other peaks result from the hard metal substrate (WC).

The hardness of the layer is 2800 HV.

Example 5

In a further example, a layer sequence as in example 4 is created by means of HIPIMS, wherein the electrical power averaged over time applied to the targets is equal to that of example 4. During the pulse, the average voltage is 650 V and the maximum power density in front of the target is 4 $kW/cm^2$. The hardness is 3100 HV.

The invention claimed is:

1. A body, comprising a substrate, and a hard material layer applied to the substrate, said layer being deposited by means of magnetron sputtering to at least partially cover said body characterized in that the hard material layer comprises the metallic elements Al, Cr and Si and non-metallic elements selected from the group comprising B, C, N, O, wherein the atomic proportion of oxygen in the non-metallic elements is greater than 30%.

2. The body according to claim 1, characterized in that the atomic proportion of oxygen in the non-metallic elements is greater than 70%.

3. The body according to claim 2, characterized in that the atomic proportion of oxygen in the non-metallic elements is almost 100%.

4. The body according to claim 1, characterized in that the metallic elements Al, Cr and Si in the hard material layer have a composition of the Al x Cr y Si z type, wherein x, y and z are the percentages of the three elements in atom % amongst each other, and x, y, z satisfy the conditions: x=100%−y−z, 1%≦y≦70% and 0.1≦z≦20%.

5. The body according to claim 1, characterized in that in the hard material layer, the atomic proportion of the metallic elements from the group comprising Al, Cr, Si is overall more than 50 atom %.

6. The body according to claim 5, characterized in that in the hard material layer, the atomic proportion of the metallic elements from the group comprising Al, Cr, Si is more than 80 atom %.

7. The body according to claim 6, characterized in that in the hard material layer, the atomic proportion of the metallic elements from the group comprising Al, Cr, Si is almost 100 atom %.

8. The body according to claim 1, characterized in that between the substrate and the hard material layer there is an adhesion layer composed of a selection of elements from the group comprising Al, Si and elements of the groups 4-6 of the period system according to IUPAC (1988), and of a selection of non-metallic elements from the group comprising B, C, N, O.

9. The body according to claim 8, characterized in that the metallic elements of the adhesion layer are selected from the group of metallic elements of the hard material layer and the atomic proportion of N in the non-metallic elements in the adhesion layer is greater than in the hard material layer.

10. The body according to claim 8, characterized in that between the hard material layer and the adhesion layer there is a transition layer comprised of a selection of the elements which form the hard material and adhesion layers.

11. The body according to claim 10, characterized in that at least one element continuously varies in its concentration in the transition layer in the direction transverse to the layer so that the concentration of the element at the boundary to the hard material layer is essentially equal to the concentration in the hard material layer and at the boundary to the adhesion layer is essentially equal to the concentration in the adhesion layer.

12. The body according to claim 8, characterized in that the hard material layer is comprised essentially of Al, Cr, Si and O and the adhesion layer of Al, Cr, Si and N.

13. The body according to claim 8, characterized in that the adhesion layer is of (Al,Cr,Si)N.

14. The body according to claim 1, characterized in that the hard material layer is the outermost layer or the last layer before a paint, lubricant or dry lubricant layer, if any, is applied.

15. The body according to claim 10, characterized in that the body has a multi-layer coating comprised of a series of sets of layers, each set of layers having an adhesion material layer, a transition material layer over the adhesion layer, and one or more hard material layers over the adhesion layer.

16. The body according to claim 1, characterized in that the body is a cutting tool for machining.

17. The body according to claim 1, characterized in that, in the hard material layer the proportion of nitrogen in the non-metals is in the range of 10 atom %-70 atom %.

18. A method for manufacturing a hard material layer on a substrate, wherein a hard material layer is deposited on the substrate by means of magnetron sputtering, wherein the hard material layer comprises the metallic elements Al, Cr and Si and non-metallic elements selected from the group comprising B, C, N, O, wherein the atomic proportion of oxygen in the non-metallic elements is greater than 30%.

19. The method according to claim 18, wherein the hard material layer is applied by means of high-power pulsed magnetron sputtering.

20. The method according to claim 19, wherein a power density of 500-5000 W/cm$^2$ is reached at the sputtering target.

21. The method according to claim 19, wherein pulses are applied at a duty cycle of no more than 20%.

* * * * *